United States Patent [19]

Smith

[11] Patent Number: 4,945,311

[45] Date of Patent: Jul. 31, 1990

[54] ELECTRONICALLY VARIABLE EQUALIZER

[75] Inventor: Robert F. Smith, San Jose, Calif.

[73] Assignee: Seagate Technology, Inc., Scotts Valley, Calif.

[21] Appl. No.: 237,876

[22] Filed: Aug. 29, 1988

[51] Int. Cl.[5] .......................... H03B 1/00; H03K 5/00
[52] U.S. Cl. ..................................... 328/167; 307/521; 307/271
[58] Field of Search ............... 307/521, 271, 262, 511; 328/167, 155

[56] References Cited

U.S. PATENT DOCUMENTS

| | | | |
|---|---|---|---|
| 3,532,908 | 10/1970 | Jennings | 307/521 |
| 3,821,797 | 6/1974 | Suzuki et al. | 360/24 |
| 4,045,731 | 8/1977 | Tokunou et al. | 328/167 |
| 4,346,412 | 8/1982 | Conley | 360/46 |
| 4,370,681 | 1/1983 | Akagiri | 360/68 |
| 4,371,900 | 2/1983 | Haber | 360/40 |
| 4,498,111 | 2/1985 | Rijckaert et al. | 360/27 |
| 4,517,612 | 5/1985 | Rijckaert et al. | 360/67 |
| 4,562,492 | 12/1985 | Higurashi | 360/65 |
| 4,564,869 | 1/1986 | Baumeister | 360/46 |
| 4,801,827 | 1/1989 | Metz | 307/602 |
| 4,809,336 | 2/1989 | Pritchard | 307/546 |
| 4,853,802 | 8/1989 | Kukson et al. | 360/65 |

OTHER PUBLICATIONS

"Arbitrary Equalization with Simple L. C. Structures", by Kost et al., IEEE Transactions on Magnetics, vol. MAG-17, No. 6, Nov. 1981.
"Switched Resistor Resonator for an Active Bandpass Filter", IBM Technical Disclosure, vol. 23, No. 9, Feb. 1981, by Zumbado.
"Two Active Low Pass Instrumentation Filters", Instruments and Control Systems, Aug. 1971, vol. 44, No. 8, by Simpson.
"Active Band-Pass Filter", IBM Technical Disclosure, vol. 11, No. 5, Oct. 1968, Hurel et al.

Primary Examiner—Stanley D. Miller
Assistant Examiner—Richard Roseen
Attorney, Agent, or Firm—Flehr, Hohbach, Test, Albritton & Herbert

[57] ABSTRACT

One or more active RC filter network stages of an electronically variable equalizer filter have R values which can be varied to maintain a substantially constant ratio of R values for each stage to vary the cutoff frequency of the equalizer filter while maintaining the relative shapes of the magnitude and phase characteristics of the equalizer filter. A control signal is generated to simultaneously vary the R values for the various network stages. The resistance value of the RC circuit of monostable multivibrator is controlled by control signal so that the multivibrator output pulse width is equal to a reference pulse width. The control signal is utilized to obtain the same R value for a number of other R values formed on a single substrate.

17 Claims, 13 Drawing Sheets

ELECTRONICALLY VARIABLE EQUALIZER

BACKGROUND OF THE INVENTION

1. Field of the Invention.

This invention relates to electronic filters and, more particularly, to electronically variable equalizer filters having a variable cutoff frequency.

2. Prior Art.

Equalizer filters are used to shape the amplitude and phase response characteristics of a particular channel prior to processing of the signals carried by that channel. In many applications it is desirable that certain ones of the regular characteristics of the equalizer be variable. For example, it may be desirable to vary the bandwidth of an amplifier to accommodate certain operating conditions. Additionally, it may be desirable to change the gain characteristics by inserting, as required, selective boost, or gain, for certain bands of frequencies. For many applications involving digital or pulse signals, it is desirable that a constant group delay characteristic through the pass band be maintained. This ensures that all of the frequency components of a signal each have the same amount of time delay as they pass through the equalizer circuit so that the signal, or pulse, is properly amplified by the equalizer circuit without distortion in the absence of non-linear phase delay for the various frequency components.

Equalizers find application in a number of types of electronic equipment, including both conventional and constant density disk drives, magnetic tape recorders, wire recorders, optical recording devices, telecommunication channels, test equipment, radio, sonar, radar, control systems, satellite links, and other applications where amplitude, phase, and bandwidth shaping are required. These equipments and applications may require different transfer characteristics under various operating conditions and loads. For example, when it is known that an incoming signal has a restricted narrower bandwidth, it is desirable to narrow the pass band of the equalizer to improve the signal-to-noise ratio.

For example, in reading the information from a constant density magnetic disk which records a constant wavelength in the magnetic media disk, the servo signal clock frequency, or recovered read clock frequency, varies as a function of the physical position of a recording track on a disk. Assuming a constant rotational speed of the disk, the signal wavelength typically varies two-to-one from the inner to outer tracks. The information signals associated with the servo signal clock frequency will vary over a two-to-one range.

To optimize the signal-to-noise ratio for the information signals in a read channel, the bandwidth of an equalizer filter may be varied as a function of the servo signal clock frequency.

Prior art constant density magnetic recording systems change bandwidth, for example, by band-switching components to realize three or four discrete filter configurations.

Prior art approaches to providing a variation in characteristics for an equalizer include band switching transfer using, for example, analog switches to switch inductions and capacitors in three or four bands to obtain a desired performance characteristic.

SUMMARY OF THE INVENTION

It is therefore an object of the invention to provide an electronically variable equalizer filter which provides a continuous range of adjustment for the cutoff frequency of an equalizer filter circuit.

It is another object of the invention to provide an equalizer which has adjustable characteristics and which is low cost, efficiently packaged, relatively temperature insensitive, and suitable for integration into an integrated circuit chip.

It is also an object of the invention to provide an equalizer having an adjustable bandpass which maintains a linear phase characteristic and group delay over a desired operating frequency range.

It is also an object of the invention to provide a frequency agile equalizer which provides both odd and even output functions.

In accordance with these and other objects of the invention, an electronically variable equalizer filter is provided which has a continuously variable cutoff frequency adjustment capability. In broad terms, the invention provides one or more active RC filter networks which have variable R, resistance, values. These active RC networks are coupled together to form the stages of an equalizer filter. The R values of the various active filter network stages are simultaneously varied such that a substantially constant ratio between the R values of a particular active RC filter network are maintained. This ensures that the relative shapes of the magnitude and phase characteristics of each active RC network remains substantially constant as the cutoff frequency for the equalizer filter is varied.

The R values of the active RC networks are controlled by a control signal. According to one aspect of the invention, means for generating the control signal are provided which include a reference clock frequency generator which provides a reference signal which triggers a pair of monostable multivibrator circuits. The output pulse widths of the two monostable multivibrators are compared in a difference computer circuit, the output of which is indicative of the difference in pulse widths of the output signals of the two monostable multivibrators. One of the monostable multivibrators has a reference RC circuit with a RC value which controls the pulse width for the output of that monostable multivibrator. The second monostable multivibrator has a variable RC circuit with an input terminal for controlling the R value of that circuit. The output of the difference computer circuit is fed through an integrator, the output of which is coupled to the input terminal of the variable RC circuit for controlling that RC value. The RC value is controlled so that it matches the value of the reference RC value of the other monostable multivibrator.

In one embodiment of the invention one of the active RC networks is an active low pass filter stage while another of the active RC networks is an active notch filter stage. The inputs of each of these filter stages are coupled together to provide two signal channels: one channel through the active low pass filter and the other channel through the active notch filter. The output signal of the notch filter is subtracted from the output signal of the active low pass filter to provide a frequency boost in the response characteristic of the variable equalizer filter. Means are provided for varying the output signal level of the active notch filter to control the amount of frequency boost given to the response characteristic of the variable filter. The transfer function of the active low pass filter and the transfer function of the active notch filter both have the same poles to provide substantially constant group delay through the pass band of the variable filter over its range of passband adjustments. In actual practice the output of the notch filter is combined with the output of one section of the low-pass filter and the combined signal is fed through successive low-pass sections.

According to another aspect of the invention an electronically variable equalizer filter is provided which has a variable cutoff frequency. The equalizer filter has active RC network stages and control means for simultaneously varying the R values of said active RC network stages. This embodiment of the invention utilizes a reference signal means which provides a reference signal having a predetermined frequency and a predetermined pulse width. For example, one such reference signal includes a square wave signal from the output of a divide-by-two circuit at the output of a frequency synthesizer. A one shot monostable multivibrator circuit is triggered by the reference signal. The one-shot monostable multivibrator includes a variable resistor which determines the pulse width of the output signal of that one-shot multi-vibrator. The value of the variable resistor is set by a signal applied to a control terminal of the variable resistor. A comparator circuit compares the reference signal and the output of the one-shot monostable multivibrator. The output signal of the comparator is coupled back to the control terminal of the variable resistor for the one-shot monostable multivibrator so that the pulse width of the output of the one-shot monostable multivibrator is controlled by the output signal of the comparator. Thus, the R value of the active RC network stage is varied in accordance with the pulse width of the reference signal from the reference signal generator.

According to a further aspect of the invention, the reference signal generator includes a programmable frequency synthesizer which proVides programmable output reference signals, the pulse widths of which control the pulse width of the one-shot monostable multivibrator and consequently the R values of the active RC network stages.

According to another aspect of the invention, the electronically variable equalizer filter provides an even-function output signal and an odd function output signal, where the odd function output signal is the first time derivative of the even function output signal. These signals are particularly useful in digital pulse detection systems.

DETAILED DESCRIPTION OF THE PREFERRED EMBODIMENTS

Figure 1:
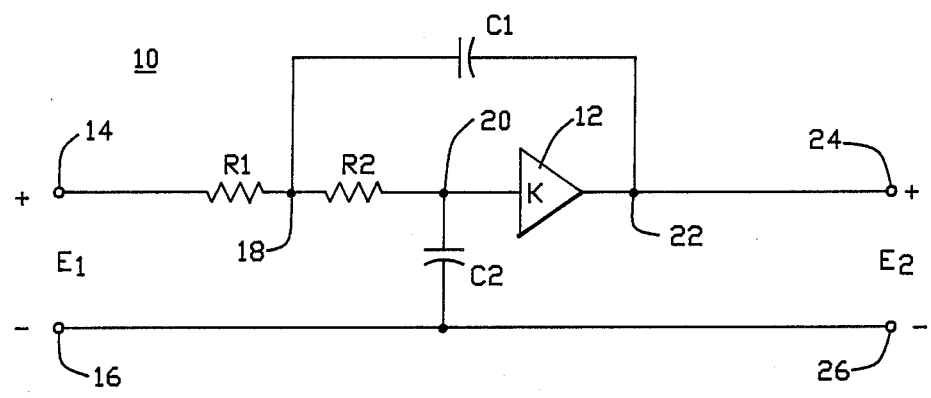
FIG. 1 shows a prior art RC active low pass filter network.

FIG. 1 shows an active RC filter 10 as known in the prior art. Amplifier 12 is a voltage-controlled voltage source, or amplifier, having a gain K. The amplifier 12 is used in conjunction with passive resistance elements R and capacitive elements C to obtain a low-pass network transfer function. An input reference voltage El is provided between an input terminal 14 and a reference terminal 16. Resistor R1 is connected between the input terminal 14 and a node 18. Resistor R2 is connected between node 18 and input node 20 of the amplifier 12. A capacitor C2 is connected between the input node 20 and the reference node 16. A capacitor C1 is connected between the node 18 and the output terminal 22 of the amplifier 12. Output node 22 is connected to the output terminal 24 for the network. An output voltage E2 is obtained between the output terminal 24 and the output reference terminal 26, which is coupled to the input reference terminal 16.

The voltage transfer function for the low-pass network as shown in FIG. 1 is set forth in equation 1.

$$\frac{E_2}{E_1} = \frac{K \frac{1}{R_1 R_2 C_1 C_2}}{S^2 + S\left[\frac{1}{R_1 C_1} + \frac{1}{R_2 C_1} + \frac{(1-K)}{C_2 R_2}\right] + \frac{1}{R_1 R_2 C_1 C_2}} \quad (1)$$

Equation 2 sets forth the voltage transfer function for a generalized low-pass active network.

$$\frac{E_2}{E_1} = \frac{K W_0^2}{S^2 + X W_0 S + W_0^2} \quad (2)$$

Note that the coefficient of the gain factor in the denominator of equation 2 is equal to the square of the radian cutoff frequency for the network. Equation 3 shows that the radian cutoff frequency for the network is equal to the square root of the inverse of the product of the resistor values R1, R2, C1, and C3.

$$W_o = \sqrt{\frac{1}{R_1 R_2 C_1 C_2}} \quad (3)$$

Examination of equations 1, 2 and 3 shows that the gain in the pass band, that is, the low frequency gain, for the amplifier is found by evaluating equation 1 as S approaches 0. For this condition, gain is equal to K. It should also be noted that the radian cutoff frequency for the low pass filter as shown can be controlled by changing the values of the resistors R1, R2 and capacitors C1, C2, without changing the gain in the pass band. If the components are changed such that the ratio of the two resistors or capacitors remain the same then the relative shape of the magnitude characteristic and of the phase characteristic of the network will remain unchanged. This circuit therefore has the feature that its cutoff frequency can be varied by changing the resistor values.

Figure 2A:
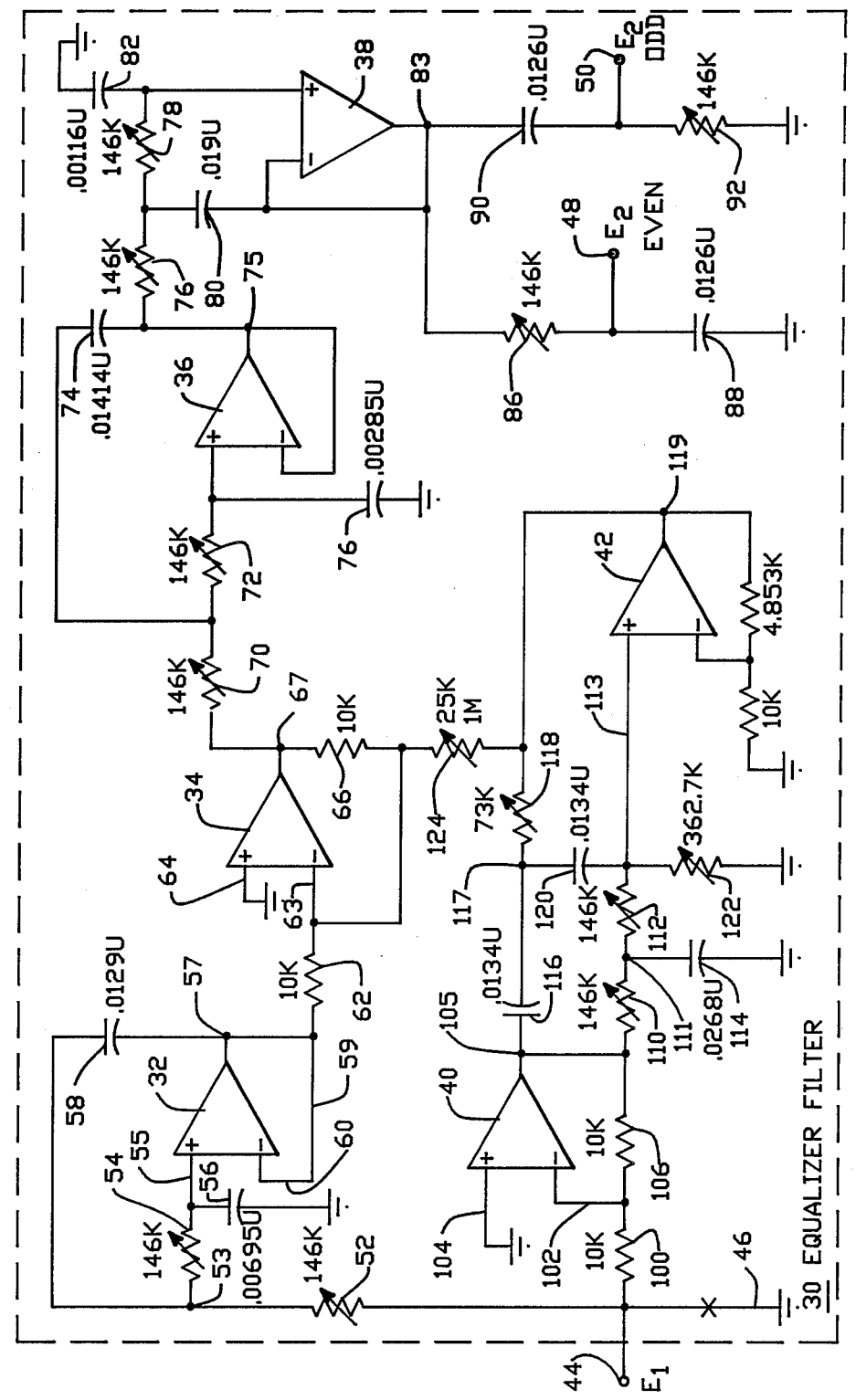
FIG. 2A shows a number of active RC filter network stages configured as a low pass amplifier with a cutoff frequency of 100 Hz.

FIG. 2A shows an equalizer filter 30 having a variable cutoff frequency obtained by variation of certain resistor values, according to the invention. A number of amplifier stages 32, 34, 36, 38, 40, and 42 are coupled together as described hereinbelow. Each of these amplifiers along with various resistance and capacitance elements forms one stage of the equalizer filter 30. An input voltage E1 is applied between an input terminal 44 and a circuit-ground reference terminal 46. Two outputs are obtained from the equalizer filter 30. One of them is an even channel output E2even obtained at an output terminal 48. The other output is an odd channel output signal E2 odd obtained at an output terminal 50. The resistance and capacitance values were chosen to provide the normalized voltage transfer function for the even channel as shown in equation 4. The odd channel transfer function has an S multiplying the entire numerator of equation 4 to indicate that the odd channel signal is the time derivative of the even channel signal.

$$\frac{1 - k \ (S^2 + [0.813939]^2)}{(S + 0.8611705)(S + 0.8422627 + j0.7793236)} \quad (4)$$
$$(S + 0.8422627 - j0.7793236) \ (S + 0.7709414 + j1.535203)$$
$$(S + 0.7709414 - j1.535203) \ (S + 0.5726417 + j2.245733)$$
$$(S + 0.5726417 - j2.245733)$$

The elements of the equalizer filter 30 as shown in FIG. 2A are connected as follows:

The main signal path proceeds from input terminal 44 through amplifiers 32, 34, 36, and 38 to one of the output terminals 48, 50. A second signal path proceeds from input terminal 44 through amplifiers 40, 42 and is summed into the main signal path at amplifier 34.

Note that the RC active networks for the second path forms a twin-T notch filter.

The first stage of the main signal path is a Sallen-Key low-pass filter stage of the type shown in FIG. 1 of the drawings. Input resistor 52 corresponds to resistor R1 and is coupled between the input terminal 44 and a node 53. Resistor 54 corresponds to resistor R2 and is coupled between the node 53 and the noninverting input terminal 55 of the amplifier 32. A capacitor 56 corresponding to C2 is coupled between the input terminal 55 and the ground reference. The output terminal 57 of the amplifier 32 is connected through capacitor 58 corresponding to C1 to the node 53. The output terminal 57 of the amplifier 32 is also connected by the line 59 to the inverting-input terminal 60 of the amplifier 32. The voltage transfer function of the RC active network stage formed as described has a transfer function as shown by equation 1.

The next stage is a unity gain summer formed with amplifier 34 having a 10K ohm resistor 62 coupled between terminal 57 and the inverting input terminal 63 of the amplifier 34. The noninverting input terminal 64 of the amplifier 34 is connected to the reference ground potential. A 10K ohm feedback resistor 66 is connected between the output terminal 67 of the amplifier 34 and the input terminal 63 of the amplifier 34. This stage forms an inverting amplifier.

Similar to the active network stage formed with amplifier 32, amplifier 36 and resistors 70, 72 and capacitors 74, 76 form a Sallen-Key low-pass RC active network stage which has the same transfer function as indicated in equation 1. Input to this stage is obtained through resistor 70 being coupled to the output terminal 67 of the amplifier 34, while the output of this stage is obtained at terminal 75.

A third low-pass RC active network stage is similarly formed from amplifier 38 and resistors 76, 78 with capacitors 80, 82. This stage also has a transfer function as shown in equation 2.

The output terminal 83 of amplifier 38 drives a first series circuit comprising a resistor 86 coupled to the output terminal 83 and to the one output terminal 48. A capacitor 88 is coupled between the one output terminal 48 and the ground reference potential. Another series circuit is formed with a capacitor 90 being coupled between an output terminal 83 of the amplifier 38 and the equalizer output terminal 50 while a resistor 92 is coupled between the output terminal 50 and the ground reference potential.

Each of these series circuits is arranged to have the same time constant and are each driven in parallel from the output of amplifier 38. This provides an even function output E2even signal at output terminal 48 and an odd function E2odd signal at the output terminal 50. The relationship of the even and odd functions is that the odd function is the first derivative with respect to time of the even function. This relationship is useful in, for example, detecting an output pulse signal from a magnetic recording head where the even pulse is used for level qualification and the odd pulse is used to determine a zero crossing point. Both the even pulse and the odd pulse are then processed to determine an output pulse signal.

The second signal path for the equalizer filter 30 formed by amplifiers 40 and 42 includes an inverter stage formed by a resistor 100 coupled between the input terminal 44 of the equalizer filter and the inverting input terminal 102 of the amplifier 40 which has its noninverting input terminal 104 coupled to the reference ground potential. The output terminal 105 of the amplifier 40 is connected through a feedback resistor 106 to the input terminal 102. This provides an inversion of the input signal appearing at the input terminal 44.

The next stage in the second signal path of the equalizer filter 30 is a twin-T active network stage in which resistor 110 is coupled between the output terminal 105 of amplifier 40 and a node 111. A resistor 112 is coupled between the node 111 and the noninverting input terminal 113 of the amplifier 42. A capacitor 114 is coupled between the node 111 and the ground reference potential. Resistors 110 and 112 and capacitor 114 form a portion of the input network for the twin-tee filter. The remainder of the input network includes a capacitor 116 connected between the output terminal 105 of the amplifier 40 and a node 117 and a resistor 118 connected between the node 117 and the output terminal 119 of the amplifier 42. A series combination of a capacitor 120 and a resistor 122 is coupled between the node 117 and the ground reference potential. The connection between 120 and 122 is also at node 113. The combination of the capacitors 116, 120 and resistors 118, 122 form a filter section receiving a signal from the amplifier 42 output and fed back to the input of this stage. The output from terminal 119 of the amplifier 42 is fed through a variable resistor 124 to the inverting input of the amplifier 34. This resistor 124 thus couples the output of the twin-T filter network to the main signal channel of the equalizer filter 30. The transfer function of the twin-T filter stage is selected such it has two zeros in its transfer function numerator while the poles of its transfer function are identical to those of the first low-pass filter stage formed with amplifier 32. Thus the passband of the equalizer filter has substantially constant group delay.

The twin-T filters stage transfer function (see 626 in FIG. 14) is subtracted from the transfer function of the main channel amplifier 32 (see 622 in FIG. 14) such that a boost, or increase in amplitude response, can be provided at the twin-T notch frequency by adjustment of the variable resistor 124. The effect of the increase in amplitude response at the notch frequency of the twin-T stage is to sharpen, or slim, a pulse traveling through said equalizer filter 30.

As shown in FIG. 2A, the resistors 52, 54, 70, 72, 76, 78, 86, and 92 for the RC active network stages of the main channel of the equalizer filter 30 are variable resistors which are set, for example, to a nominal value of 146K ohms in a nominal 100 Hz cutoff frequency version of the equalizer filter 30. Resistors 110 and 112 of the twin-T filter are also nominally set to 146K ohms while resistor 118 of the twin-T filter is set to 73K ohms and resistor 122 is set to 362.7K ohms. Note that resistor 118 is obtained by the parallel combination of two 146K ohm resistors while resistor R122 can be obtained by the series combination of two 146K ohm resistors and a 73K ohm resistor. All of these variable resistors can be implemented as field effect transistors having variable channel resistances. They may also be realized as diode bridges, transconductance amplifiers or other synthesis methods.

Figure 2B:
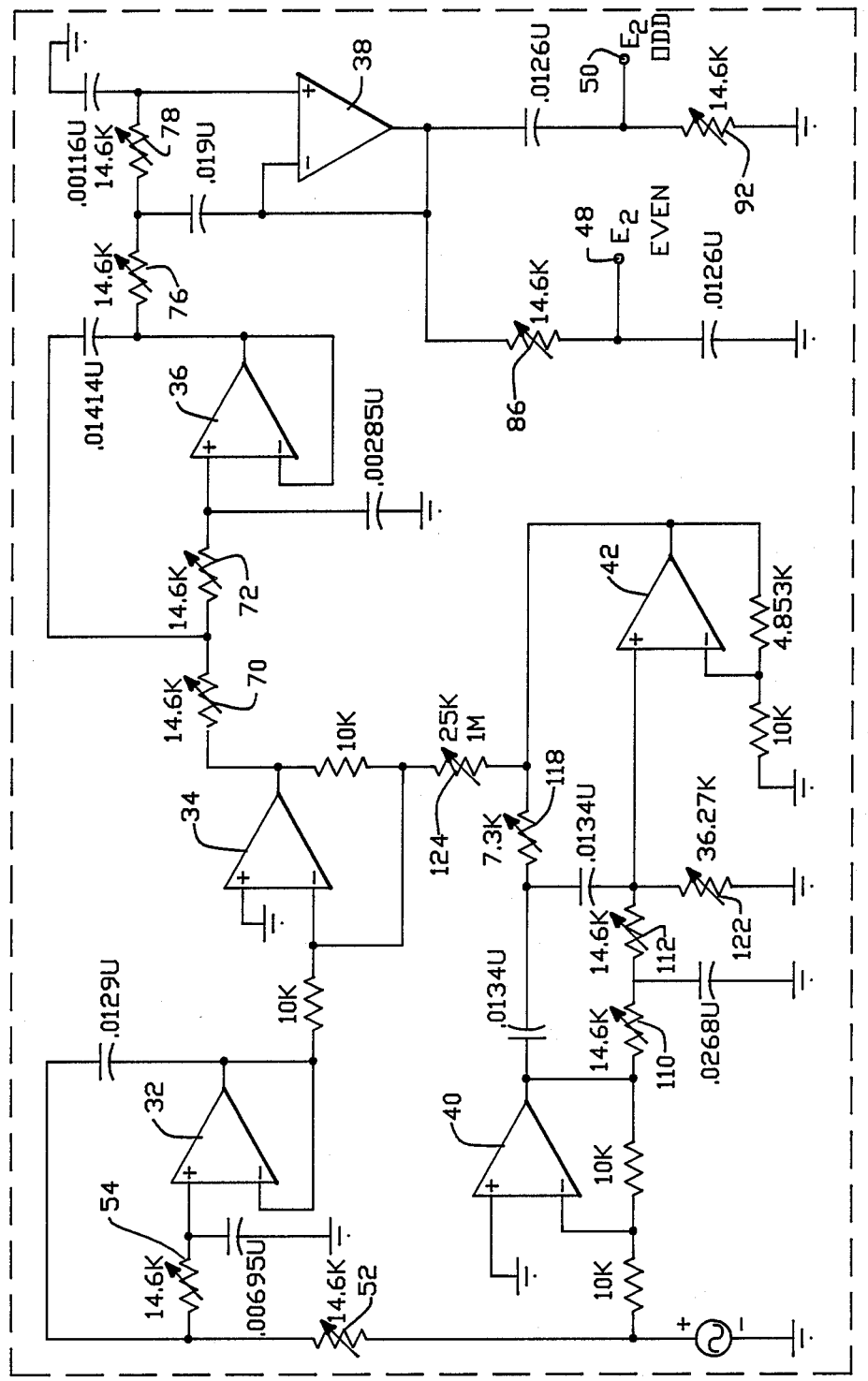
FIG. 2B is the same configuration as FIG. 1 with the variable resistor values set to obtain a 1 kHz cutoff frequency.

For the equalizer filter 30 operating with a 1 kHz cutoff frequency, the configuration of FIG. 2B, which is identical to that of FIG. 2A, shows that the variable resistors have respective values of 14.6K ohms, 7.3K ohms, and 36.27K ohms respectively. Note that the values for resistors 86 and 92, which provide the even and odd output signals, are also scaled down by a factor of 10. Referring to equations 1 and 3 it can be seen that, if the values of the capacitor C1 and C2 are constant, the value of the radian cutoff frequency will change by a factor of 10 when the resistors R1 and R2 are each decreased by a factor of 10.

Note that the value of resistor 124 which connects the output of the twin-T filters to the main channel can be controlled to have a value of 1 megohm, to thereby effectively remove the frequency boost from the equalizer filter 30 transfer function. Resistor 124 controls the value of k in the numerator of equation 4. Reduction of k minimizes the terms appearing after the negative sign in the numerator of equation 4.

Figure 3:
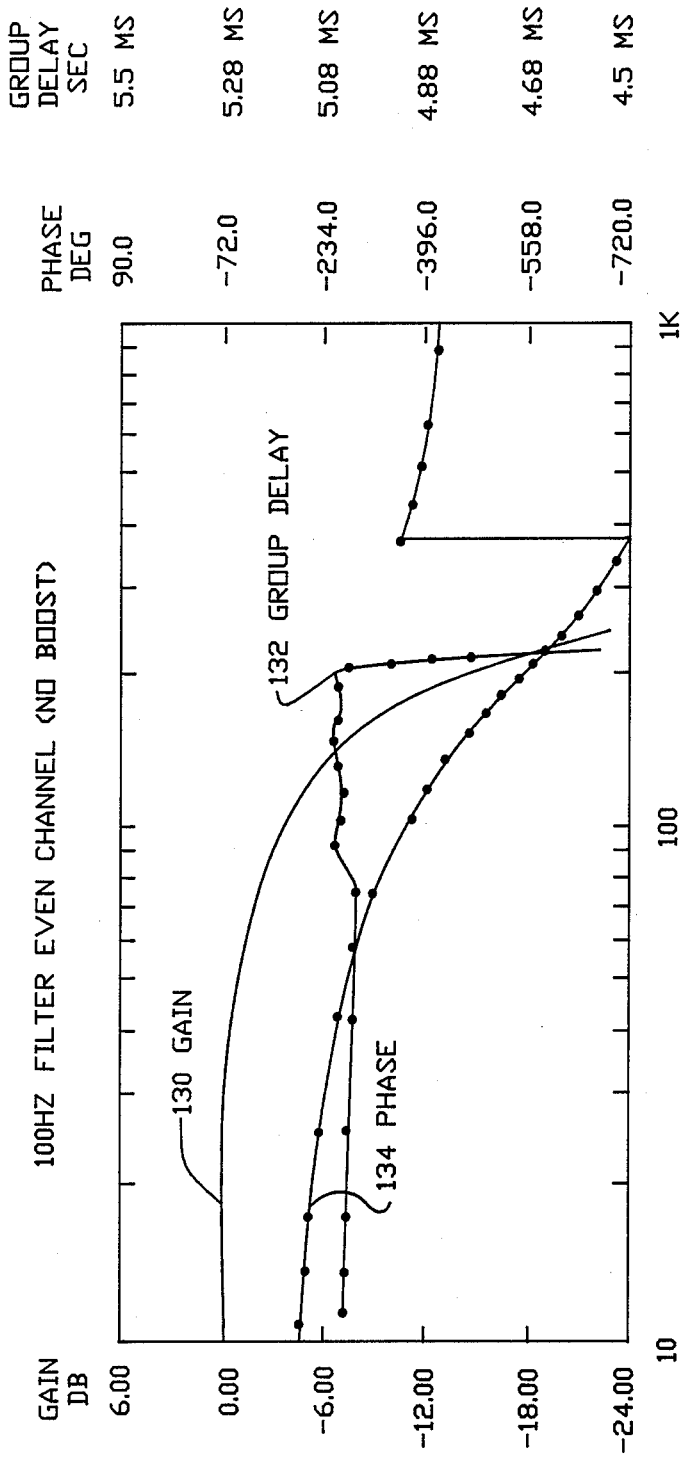
FIG. 3 shows plots of gain, phase, and group delay versus frequency for an even channel with no boost of a 100 Hz filter.

FIGS. 3 through 10 show plots of gain in db, phase in degrees, and group delay in seconds, all as functions of frequency in Hz, for various operational modes, for which the equalizer filter 30 can be programmed. For example, FIG. 3 shows a configuration for a 100 Hz low-pass filter having no boost with the output being taken from the even channel output terminal 48. As shown by gain plot 130, bandwidth is approximately 100 Hz with a mid-band gain of 0 db. The phase is relatively linear as shown in phase plot 134 and in the group delay across the passband is relatively constant as shown by group-delay plot 132. For this configuration the variable resistors 52, 54, 70, 72, 76, 78, 86, 92, 110, 112, are set to nominal values of 146K ohms while variable resistor 122 is set for 362.7K ohms and variable resistor 118 is set to 73K ohms. Variable resistor 124 is set to the 1 megohm value to provide no boost to the higher frequencies within the passband such that the gain response 130 rolls off smoothly at the upper end of the passband.

Figure 4:
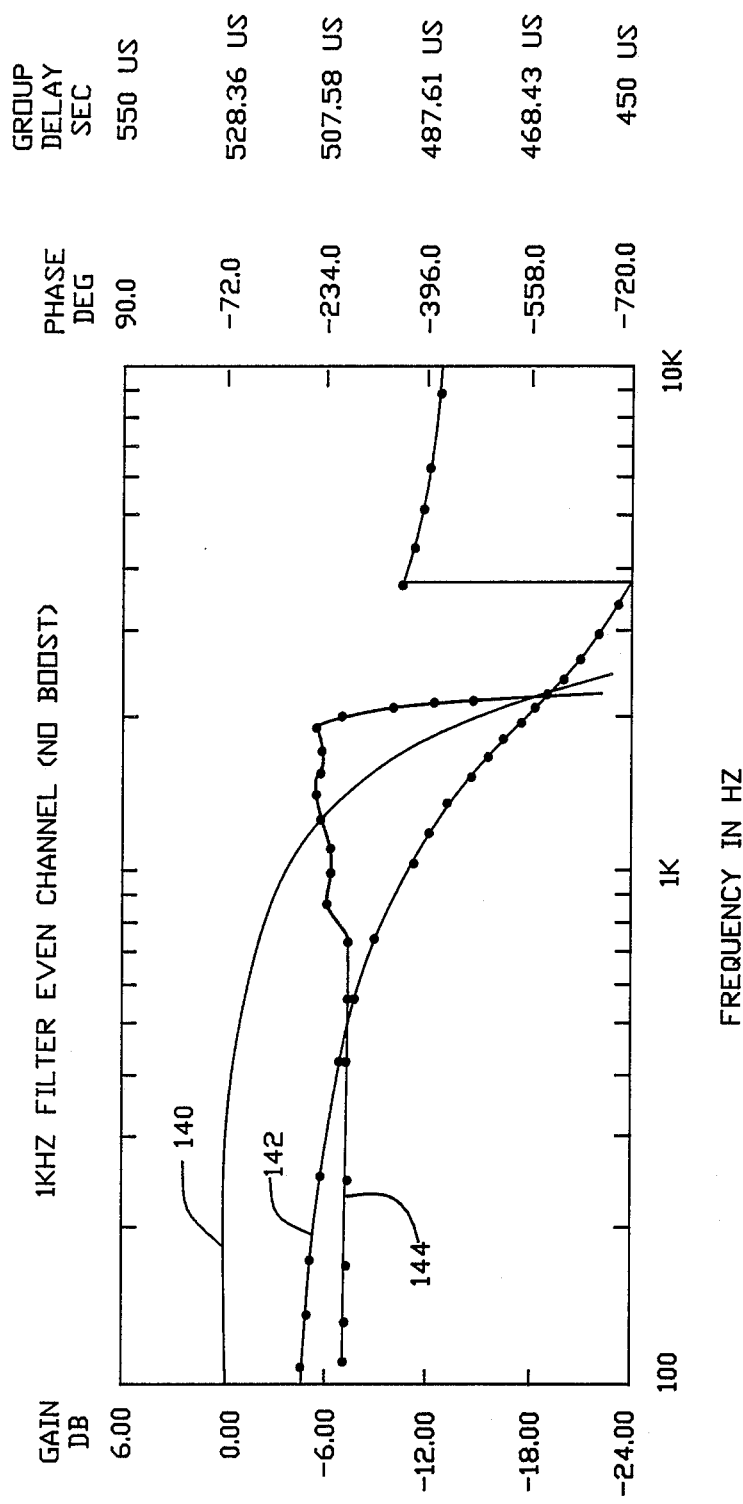
FIG. 4 shows a plot of gain, phase, and group delay versus frequency for an even channel with no boost of a 1 kHz filter.

FIG. 4 shows plots for a 1 kHz passband for the even channel with its output at output terminal 48. The gain plot 140 has a characteristic shape very similar to that shown for the gain plot 130 of FIG. 3. Similarly, the phase plot 142 and the group delay plot 144 are very much like those shown in FIG. 3, with the exception that the cutoff frequency in FIG. 4 is at 1 kHz. The very close similarities in the shapes of plots is to be expected because the cutoff frequency of the equalizer 30 is modified by changing the values of R1 and R2 in the equations 1 and 3. The circuit configuration for the plots of FIG. 4 is that of FIG. 2B wherein variable resistors 52, 54, 70, 72, 76, 78, 86, 92, 110, and 112 are set for 14.6K ohms and variable resistor R122 is set to 36.27K ohms and variable resistor 118 is set to 7.3K ohms. Coupling resistor 124 for this configuration is set to the one megohm value to provide no upper frequency boost to the transfer function.

Except for the 10 to 1 change in scale between the frequency scales, FIG. 3 and FIG. 4 have plot shapes which are almost identical for the respective even channel outputs obtained at output terminal 48.

Figure 5:
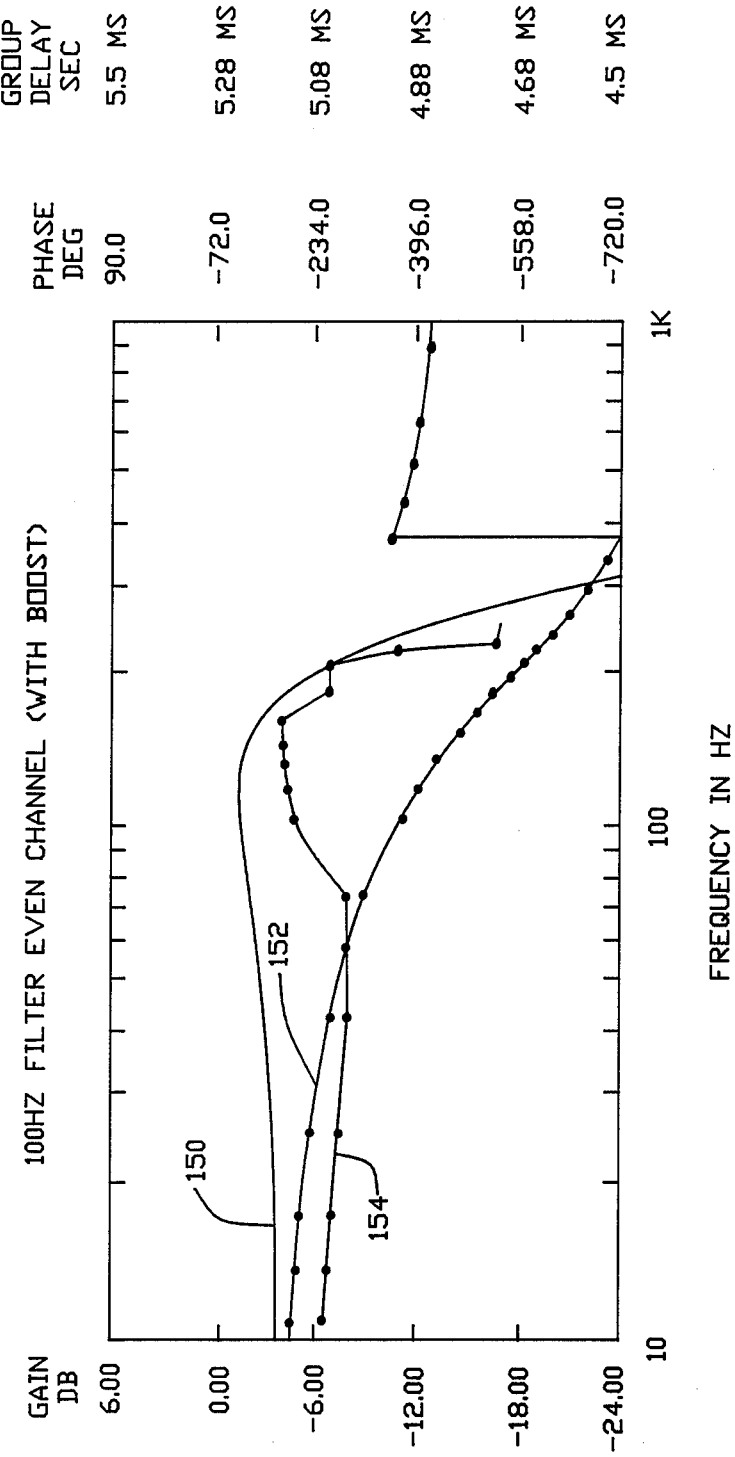
FIG. 5 shows a plot of gain, phase, and group delay versus frequency for an even channel with boost of a 100 Hz filter.

FIG. 5 shows a response characteristic for a 100 Hz filter output taken from the even channel output terminal 48 of FIG. 2A with frequency boost provided for the higher frequencies within the passband by the twin-T configuration of amplifier 42 with variable resistor 124 set for 25K ohms. The gain plot 150 shows a slight boost in amplitude near 100 Hz. The phase plot 152 shows a fairly linear phase characteristic. The group delay plot 154 shows a relatively constant group delay through the passband with an increase near the cutoff frequency caused by the boost provided by the twin-T network stage.

Figure 6:
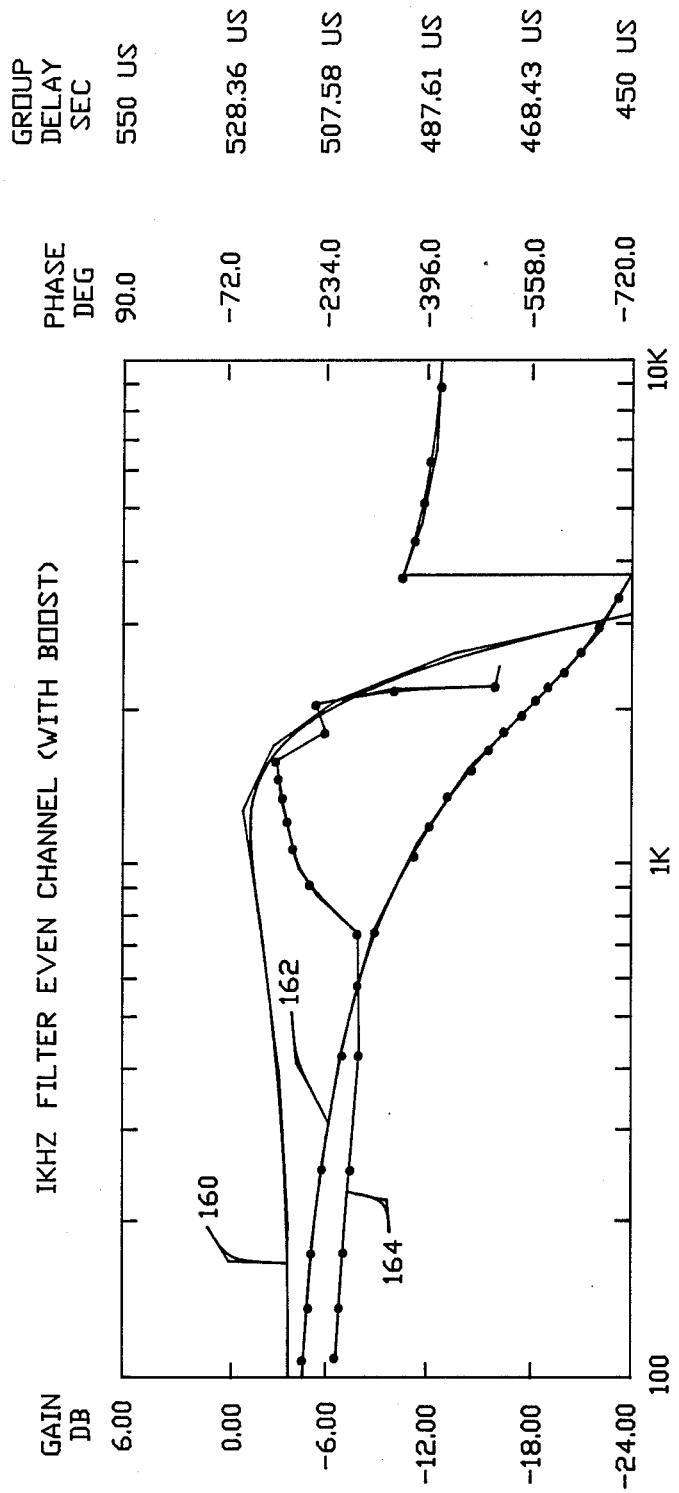
FIG. 6 shows a plot of gain, phase, and group delay versus frequency for an even channel with boost of a 1 kHz filter.

FIG. 6 shows the performance characteristics for a 1 kHz filter of FIG. 2B at its even channel output terminal 48 for a boost configuration with adaptable resistor 124 set to 25K ohms. Note that the gain plot 160, the phase plot 162 and the group delay plot 164 are very similar in shape to the respective plots for the 100 Hz cutoff configuration of FIG. 5, as predicted by equation 3.

FIGS. 7, 8, 9, and 10 show the response characteristics for the odd channel output at output terminal 50 as shown in FIGS. 2A and 2B.

Figure 7:
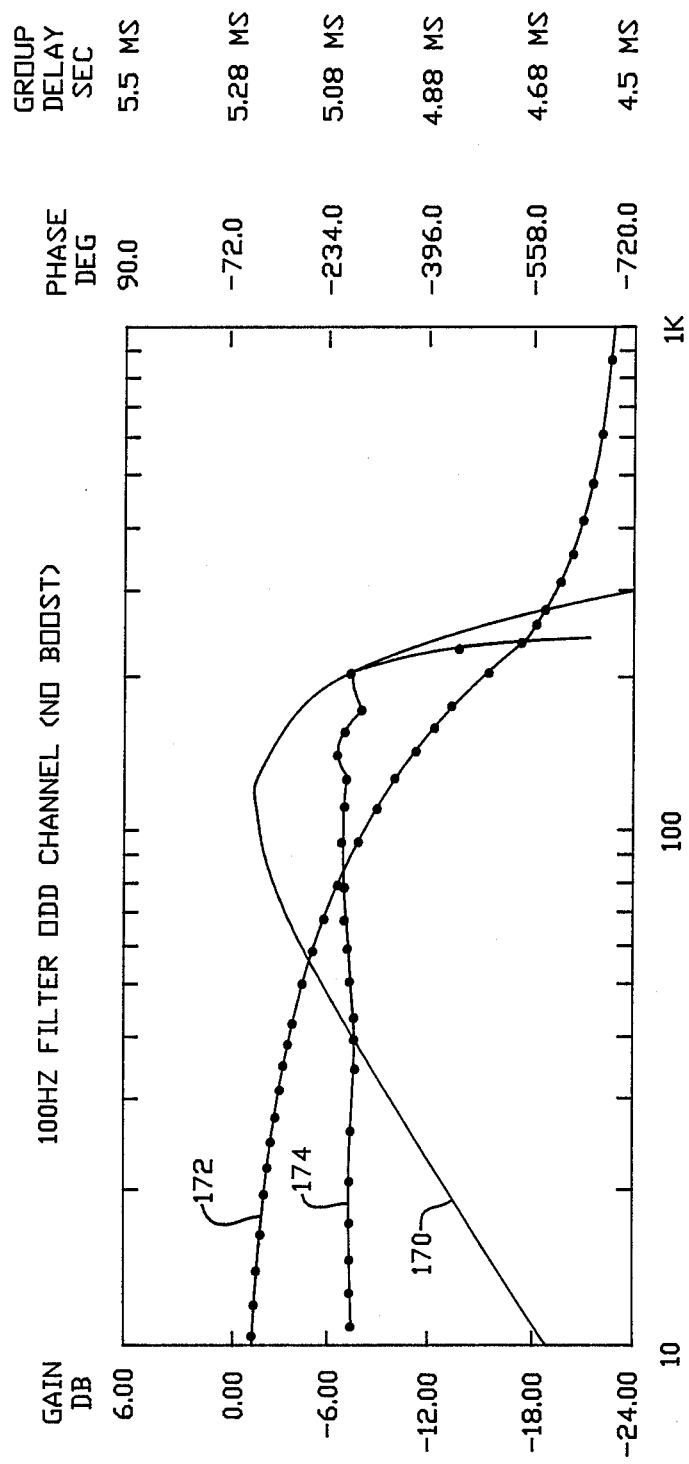
FIG. 7 shows a plot of gain, phase, and group delay versus frequency for an odd channel with no boost of a 100 Hz filter.

FIG. 7 shows the odd channel output with no boost for the same circuit values which were used to obtain the even channel characteristics as shown in FIG. 3. The gain plot 170 shows a variation of approximately 18 db over the pass range due because the series circuit comprising capacitor 90 and variable resistor 92 have values selected to provide an output signal at output terminal 50 which is the first derivative with respect to time of the even function signal provided at output terminal 48. The phase plot 172 is approximately linear over the passband and the group delay plot 174 is relatively constant over the passband.

Figure 8:
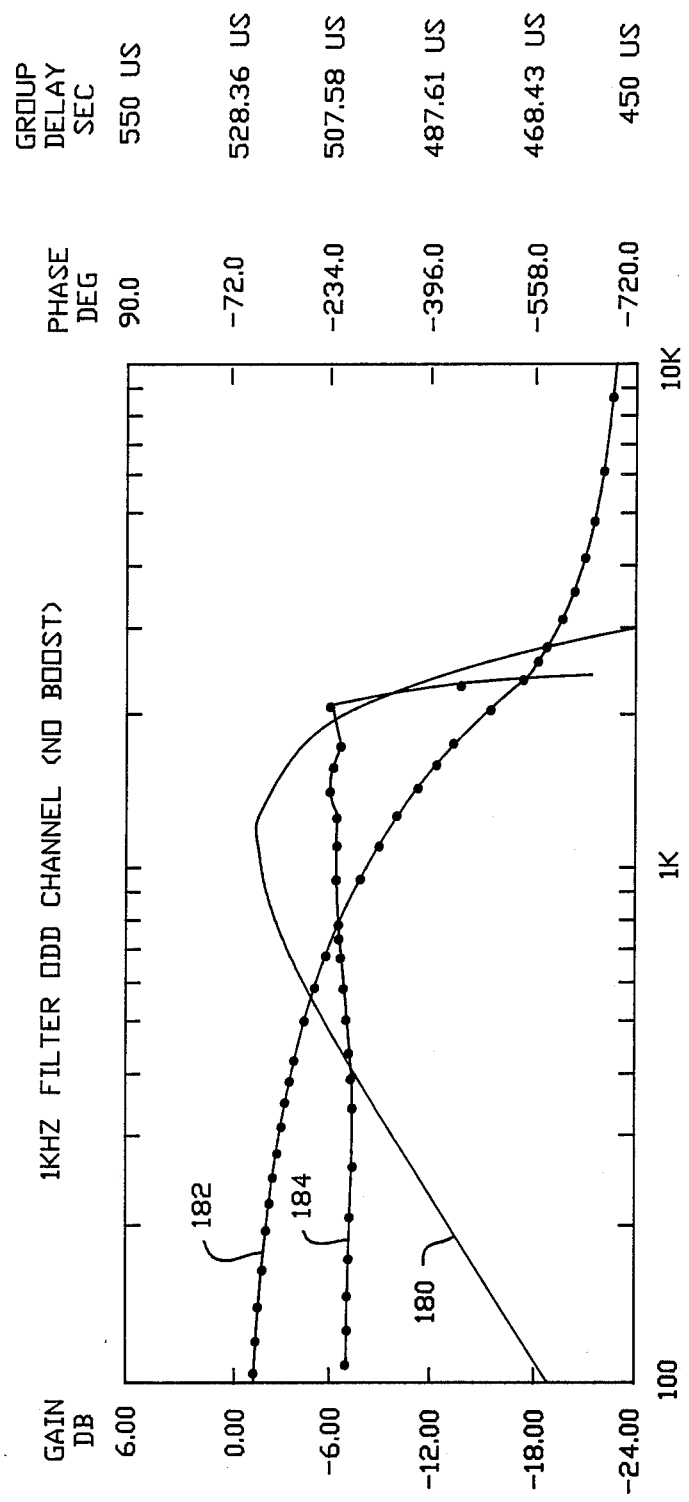
FIG. 8 shows a plot of gain, phase, and group delay versus frequency for an odd channel with no boost of a 1 kHz filter.

FIG. 8 shows the odd channel output when the equalizer filter 30 is set up for a 1 kHz passband. The gain plot 180 shows a variation of approximately 18 db because the odd channel provides a differentiated version of the even channel output. The phase plot 182 is essentially linear over the passband while the group delay plot 184 is substantially constant over the passband.

Figure 9:
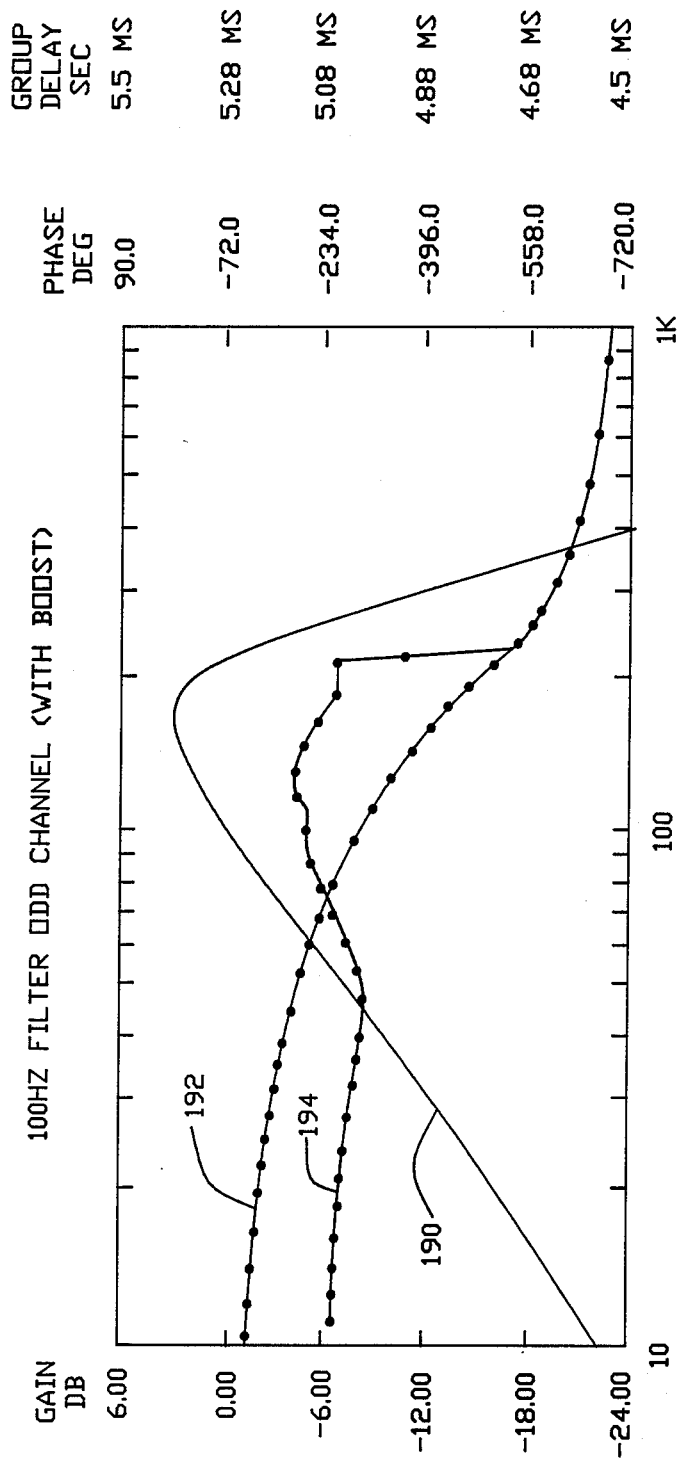
FIG. 9 shows a plot of gain, phase, and group delay as a function of frequency for an odd channel with boost of a 100 Hz filter.

FIG. 9 shows the performance characteristics of an odd channel with boost for the 100 Hz filter as shown in FIG. 2A with the coupling resistor 124 set for 25K ohms to provide approximately 24 db of gain variation across the passband as indicated by plot 190. The phase plot 192 is substantially linear across the passband, while the group delay 194 is relatively constant across the passband.

Figure 10:
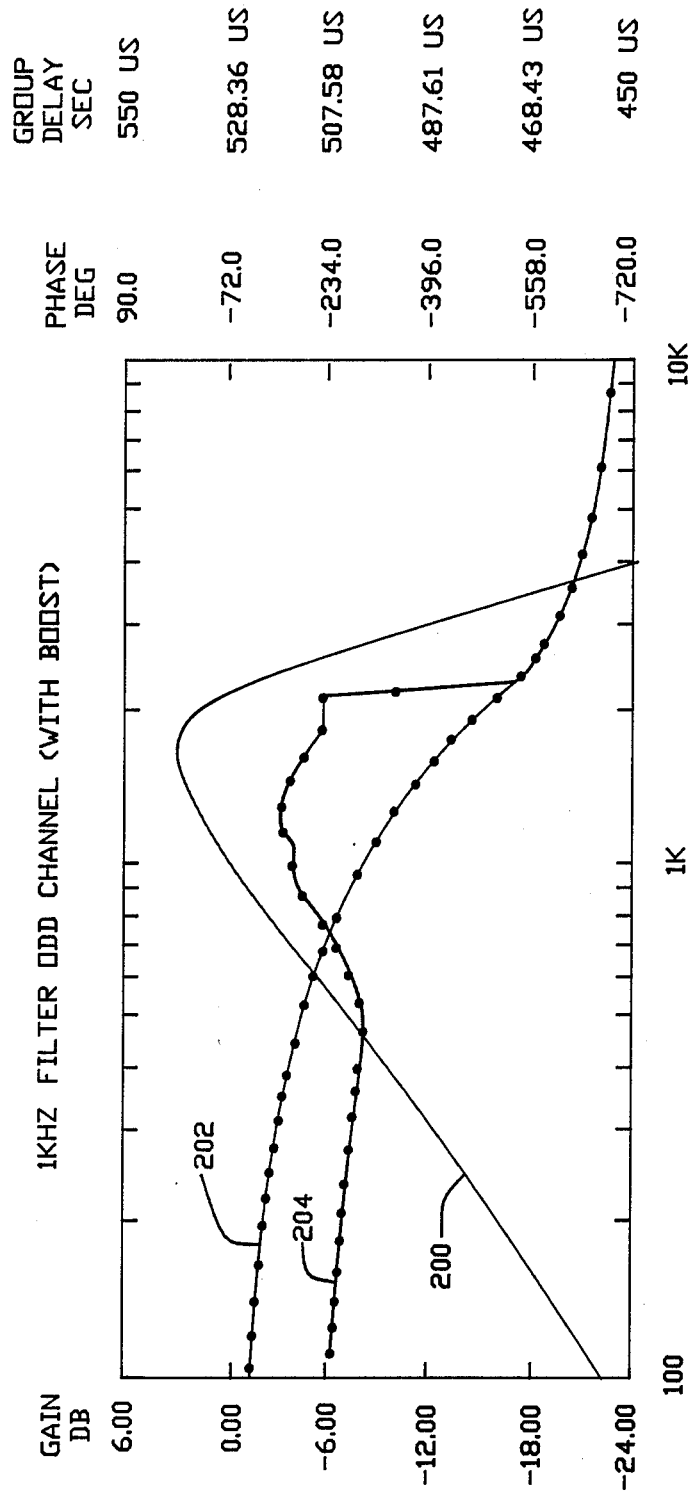
FIG. 10 shows a plot of gain, phase, and group delay versus frequency for an odd channel with boost of a 1 kHz filter.

FIG. 10 shows the performance characteristics for an odd channel with a 1 kHz cutoff frequency in an equalizer filter 30 having boost as indicated in FIG. 2B wherein coupling resistor 124 is set for 25K ohms. The gain plot 200 has a range of approximately 24 db over the passband. The phase plot 202 is substantially linear over the passband, while the group delay 204 is approximately constant over the passband with peaking near the band edge.

Referring to FIGS. 3 through 10, it is observed that the performance characteristics have substantially the same relative shape for both the 100 Hz and the 1 kHz cutoff frequency configurations. The bandpass of the equalizer filter 30 can be varied by controlling the value of the resistance elements, which are part of the RC active network stages described hereinabove, while maintaining substantially linear phase and relatively constant group delay characteristics.

When it is said that the relative shapes of the gain phase and group delay characteristic plots of the active RC networks remain substantially constant as the cutoff frequency is varied, it is meant that, except for the change in value of the frequency scale, the various plots are substantially the same as the cutoff frequency is varied over its range.

Figure 11:
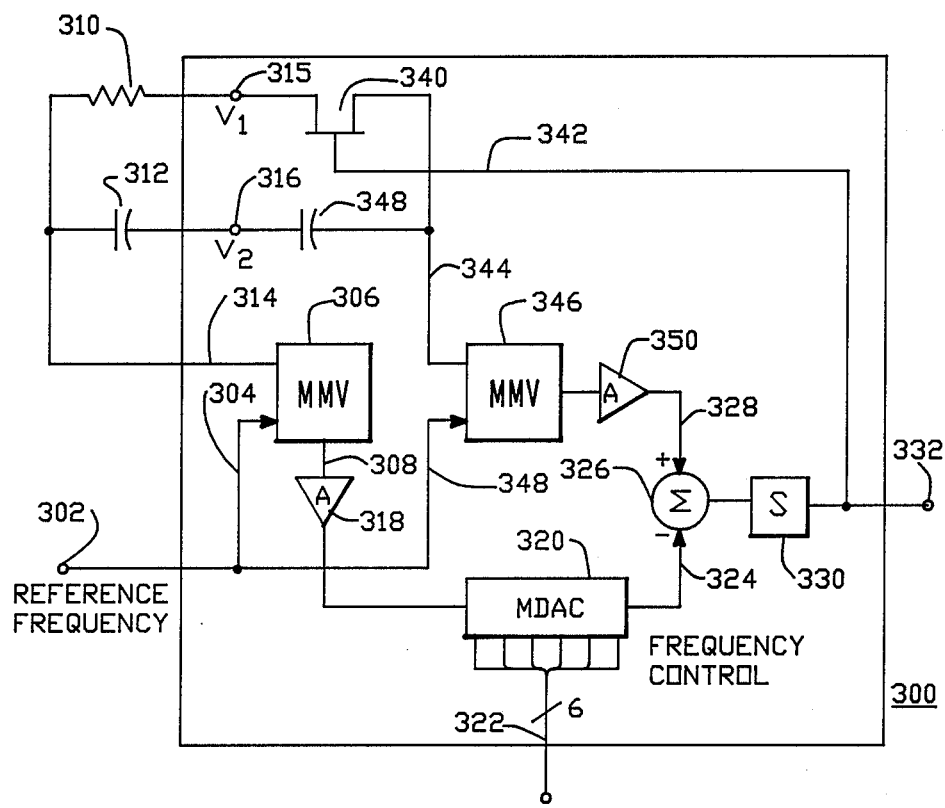
FIG. 11 is a block diagram of a system using two oneshot resistance value which is controlled by a control signal and which is equal to a predetermined percentage of an external reference resistor, according to one embodiment of the invention.

FIG. 11 shows one embodiment of an arrangement for simultaneously varying the R values of the variable resistor elements shown in the equalizer filter 30, as shown in FIG. 2A for the 100 Hz cutoff frequency configuration and in FIG. 2B for the 1 kHz cutoff frequency configuration. This circuit is designed to provide a control signal to maintain a substantially constant ratio between the variable R values such that the relative shapes of the gain, phase, and group delay characteristics have substantially constant shapes as the cutoff frequency for the equalizer filter 30 is varied over its range.

The circuit 300 shown in FIG. 11 is provided with an external reference frequency signal on an input terminal 302, which is coupled to an input terminal 304 of a first monostable multivibrator circuit 306, which is triggered by the reference frequency signal. The pulse width of the output signal provided at an output terminal 308 of the monostable multivibrator circuit 306 is controlled by the value of an external resistor 310 and the value of an external capacitor 312, which are each connected at one end to a reference terminal 314 of the monostable multivibrator 306. The other end of the reference resistor 310 is connected to a node 315 which is at a reference voltage V1. The other end of the external capacitor 312 is connected to a node 316 which is at a reference voltage V2. The output signal of the monostable multivibrator 306 is provided at a terminal 308 and is fed through a voltage limiter 318 which limits the amplitude of the output signal to a level A. The output signal of the limiter 318 is then fed to a multiplying-digital-to-analog MDAC converter 320 which scales the output of the limiter 318 to a programmed, predetermined output level. The output level of MDAC 320 is controlled by programming input signals provided on a 6-bit programming bus 322 from an external control device. The output signal from the MDAC 320 is sent on a signal line 324 to the negative input of a summer circuit 326. The output of the summer circuit 326 provides a signal indicative of the differences in pulse widths and amplitudes between the signal on line 324 and a signal on positive input signal line 328. The output signal from the summer 326 is fed into an integrator circuit 330, the output of which is fed to an output terminal 332. The output signal on terminal 332 is a control signal which is used to control the values of the variable resistors 52, 54, 70, 72, 76, 78, 86, 92, 110, 112, 122, and 118 in the various filter stages.

The variable resistors are implemented, for example, in a manner similar to that utilized to obtain the variable resistor 340, which is a field effect transistor having a control voltage applied to its gate terminal 342 to control the source-drain channel resistance thereof. The channel of the variable resistor field effect transistor 340 is connected at one end to the reference voltage V1 at node 315 and at the other end to a reference terminal 344 of a second monostable multivibrator circuit 346. A fixed capacitor 348 is coupled between the reference terminal 344 and the voltage V2 at reference node 316. The reference frequency signal from terminal 302 is also applied to a trigger input terminal 348 of the second monostable multivibrator circuit 346. The values of the reference resistance 340 and the reference capacitor 348 determine the output pulse width of the monostable multivibrator 346. The signal output of the monostable multivibrator circuit 346 is fed through a limiter 350 having a peak output of A. The output signal of limiter 350 is fed on line 328 to the positive input of the summer 326.

The value of resistance provided by the variable field effect transistor 340 is controlled by the control signal which is provided at output terminal 332 from integrator 330. This control signal is a loop error signal which is generated at the integrator 330 output. The circuit is arranged such that the control signal is fed back to control the variable resistor 340 such that the pulse width of the first monostable multivibrator 306 and the second monostable multivibrator 346 are substantially the same if the MDAC 320 is set to provide equal amplitude input signals to summer 324. When MDAC 320 is set to provide an output signal with an amplitude less than A, the value of the resistance provided by field effect transistor 340 is proportionately scaled down by the reduction factor provided by MDAC 320. The multiplying DAC 320 is used to scale down the output of the first monostable multivibrator 306 such that the time constant of the second monostable multivibrator 346 is scaled by that same factor.

Since the control signal at terminal 332 provides a precise control signal which is proportional to the resistance value desired from the variable resistor 340, the signal at terminal 332 can also be used to control the channel resistances of a number of other field effect transistors, which have similar characteristics. These other field effect transistors having similar channel resistance characteristics are obtained by being integrated on the same integrated circuit as field effect transistor 340. These other transistors can be the variable R components of active RC filter stages.

If the variable resistors shown in FIG. 2A are field effect transistors having characteristics almost identical to that of the field effect transistor 340, it is apparent that the values of the variable resistors of equalizer filter 30 can be controlled by the circuit such as shown in FIG. 11 to provide similar resistance values for a given control signal value. These resistance values can be made to track such that an equalizer filter 30 having a variable cutoff frequency can be obtained while still maintaining a linear phase characteristic and a constant group delay characteristic as desired.

Figure 12:
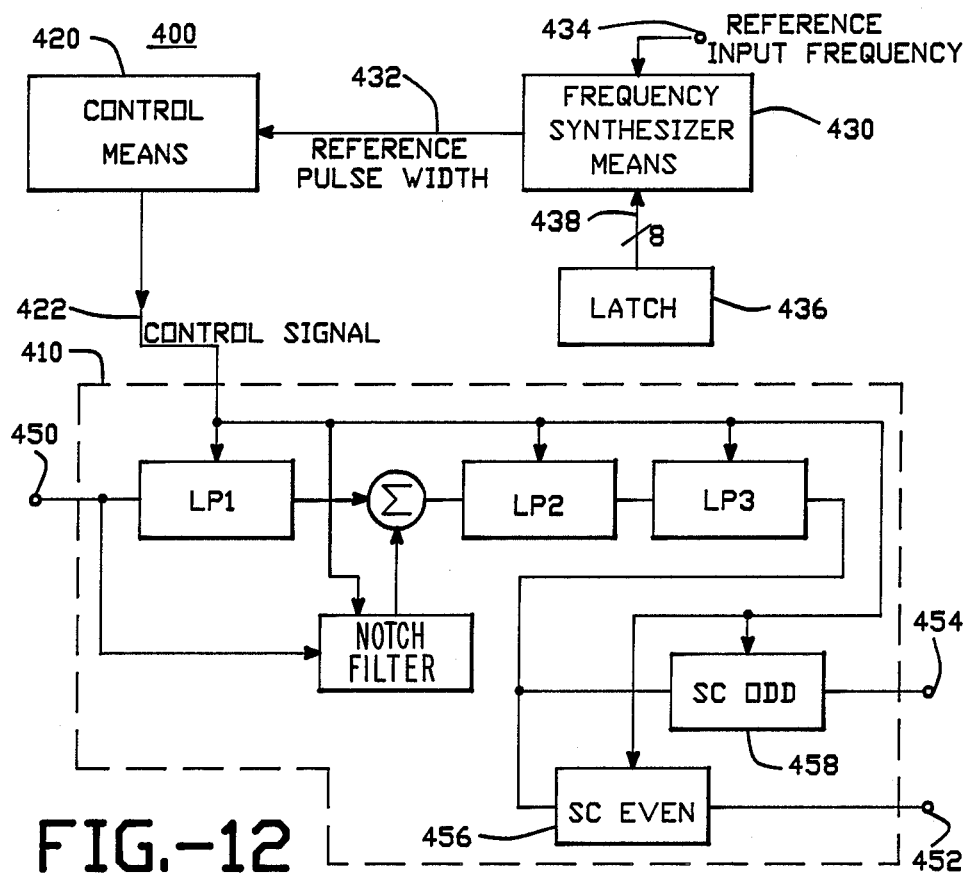
FIG. 12 is a block diagram of another electronically variable equalizer filter which used a synthesized reference frequency to control the value of the adjustable resistors in each active RC network stage.

FIG. 12 is an alternative embodiment of the invention. This particular embodiment is formed, for example, on a single integrated circuit, or chip. This circuit provides an electronically variable equalizer filter with a variable cutoff frequency.

FIG. 12 shows an equalizer filter system 400. This system includes an equalizer filter 410 as described in connection with FIGS. 2A and 2B, and a control means 420 variable resistors within the equalizer filter 410. A frequency synthesizer 430 provides as an output signal a reference signal on signal line 432. This signal has a specific pulse width. The pulse width of the reference signal is used by the control means 420 to provide an output control signal on signal line 422. The pulse width of the reference signal may vary and the signal on line 422 will vary accordingly.

The frequency synthesizer 430 has a reference input frequency signal provided on terminal 434 thereof from a signal source such as, for example, a crystal-controlled oscillator, a servo reference clock signal circuit of a disk drive, or some other signal source. A latch 436 is provided for holding, for example, an 8-bit code word which is used as the divisor in a programmable divider which is part of the frequency synthesizer 430. The divisor of the latch 436 is provided to the frequency synthesizer by means of an 8bit bus 438. Thus, the output frequency of the frequency synthesizer 430 can be controlled to be a multiple of the reference input frequency signal on terminal 434.

The equalizer filter 410 is provided with a resistance control signal on signal line 422. An input signal is coupled to input terminal 450. An even output signal is provided at a terminal 452 and an odd output signal is provided at a terminal 454.

FIG. 12 shows several RC active network stages LP1, LP2, LP3 and T-T1, which together with a series even output circuit 456 and a series odd output circuit 458 are interconnected in a manner similar to that shown in FIG. 2A. Each of these elements is fed with the resistance control signal on signal line 422 to control the variable resistors contained therein. Note that the configuration of the equalizer filter 410 is realized, for example, by the arrangement of elements as shown in the equalizer filter system 30 shown in FIG. 2A.

Figure 13:
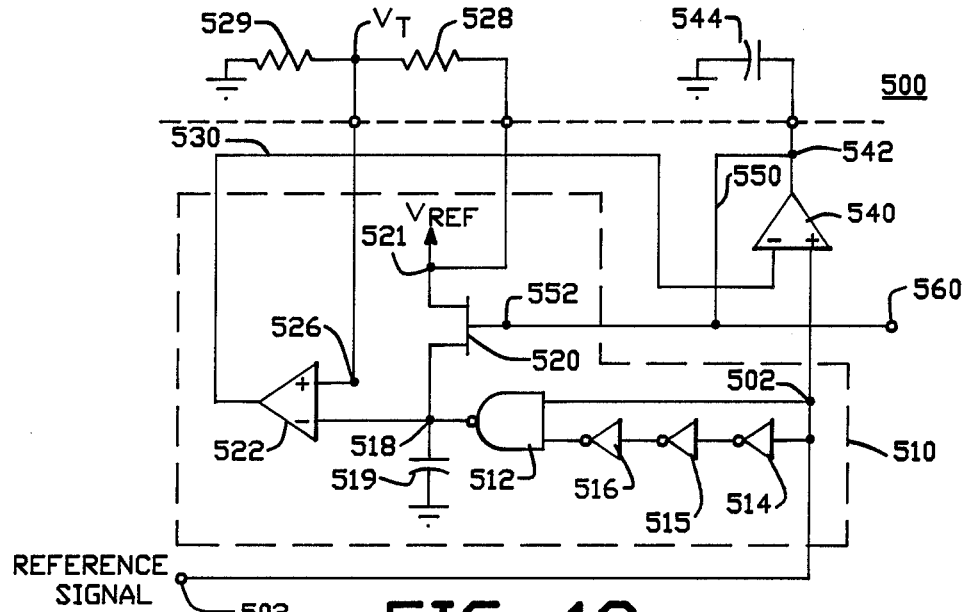
FIG. 13 is a block diagram of control signal generator circuit which provides a resistor-control signal proportional to the pulse width of a reference signal.

Referring now to FIG. 13, an example of another controller 500 which provides an output signal for controlling, for example, the value of the variable resistances in the RC network stages of the equalizer filter 410 is shown. A reference input signal is provided at an input terminal 502. This signal is, for example, a square wave provided, for example, from a frequency synthesizer such as the synthesizer 430 shown in FIG. 12. The signal is fed to an input of a one-shot monostable multivibrator circuit 510 and to the positive input of a comparator 540. The one-shot multivibrator circuit 510 includes a open-collector NAND gate 512, one input of which is fed with the reference input signal directly, while the other input receives the reference input signal inverted and delayed by the propagation delays of three inverters 514, 515, and 516. The output of the NAND gate 512 at node 518, therefore, is at a zero level for a certain time during each period of the reference signal. This zero level serves to discharge whatever voltage is on capacitor 519, which is connected between the node 519 and ground reference potential. A field effect transistor 520 having a variable channel resistance has its drain and source connected between the node 520 and a node 521 having a reference potential Vref applied thereto. The channel of the field effect transistor 520 therefore provides a resistive path for current flowing into the capacitor 519 from the Vref potential. Thus, the voltage appearing at terminal 518 will attempt to charge toward the voltage reference Vref at terminal 521. Node 518 is also connected to the negative input of a comparator 522. The positive input of the comparator 522 is connected to a node 526 which is coupled to a threshold voltage VT which is set by a voltage divider formed by a resistor 528 and resistor 529 with resistor 528 having its other end connected to the reference potential V ref on node 521.

Signals on node 518 less than the threshold voltage VT will produce a positive output signal at the output of the comparator 522, which output is coupled on a signal line 530 to the negative input of a second comparator 540. The positive input of the comparator 540 has the reference signal from input terminal 502 coupled thereto. The output signal of the comparator 540 indicates the difference between the two input signals. This output signal appears at node 542 and is filtered by a compensation capacitor 544 coupled between the node 542 and the ground reference potential. The signal is fed on a signal line 550 to the gate terminal 552 of the field effect transistor 520 and also to an output terminal 560. This signal at terminal 560 is the control signal which is a feedback control signal for the multivibrator circuit 510, which feedback signal controls the resistance of the transistor 520.

Figure 14:
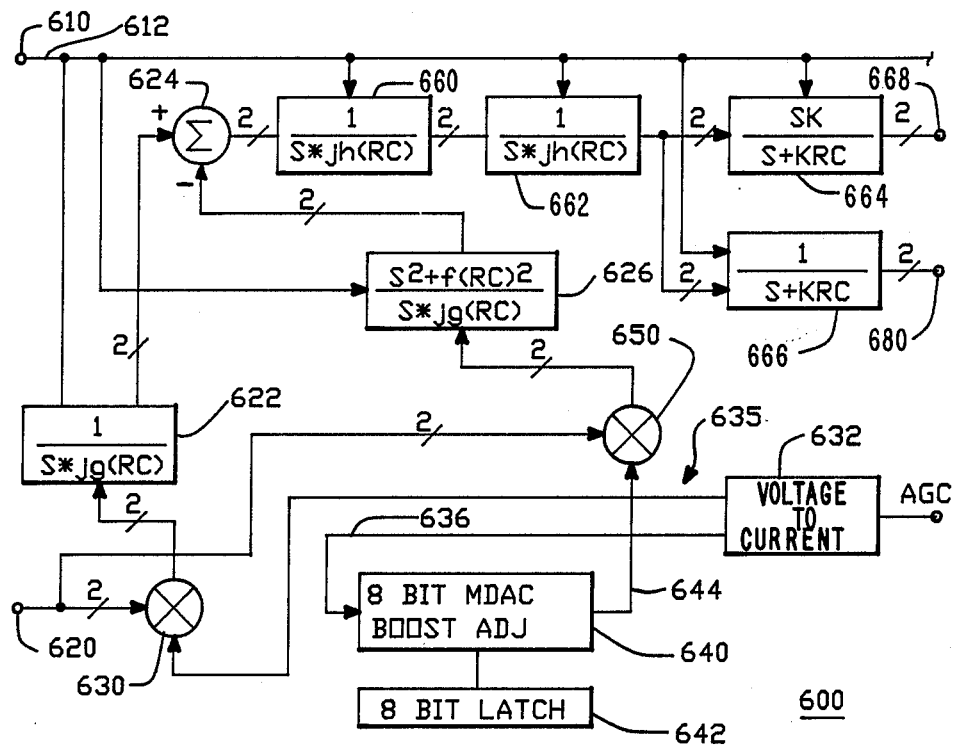
FIG. 14 is a block diagram of an equalizer filter circuit according to the invention.

FIG. 14 of the drawings shows an equalizer filter 600 which is very similar to the equalizer filter 410 as shown in FIG. 12. A control signal is applied to terminal 610 from the output terminal 560 of the controller of FIG. 13. This control signal is sent on line 612 to each variable resistor of the system 600. An input signal is provided at input terminal 620 on a differential pair of signal lines and signals are processed throughout the system in a differential format.

To obtain the even-channel transfer functions as indicated by equation 4 it is necessary that the transfer function of the first low pass filter 622 have subtracted from it in subtractor 624 the transfer function of the twinT notch filter 626. The transfer function of the twin-T notch filter 626 includes a variable gain factor k as a multiplier. The input signal is multiplied in multiplier 630 by a signal on a signal line 635 and produced at the output of a voltage-to-current converter 632. The voltage-to-current converter 632 has another output signal on line 636, which is passed through an 8-bit multiplying DAC 640, the level of which is controlled by an 8-bit code word contained in the 8-bit latch 642. The DAC 640 scales the input signal on line 636 by a factor k. The output of the 8-bit multiplying DAC 640 is fed on a signal line 644 to one input on a second multiplier 650. The other input of the second multiplier 650 receives the input signal from input terminal 620. The output of the second multiplier 650 is coupled to the input of the twin-T filter stage 626. The input to the twin-T filter stage 626 is therefore modified by the gain factor k. The output of the twin-T filter 626 is fed into the negative input of the summer 624. The result of this is that the numerator of the resultant transfer function is equal to $1-k$ (zeroes of the twin-T filter 626). Note that the poles of the first low pass filter 622 and the poles of the twin-tee filter 626 are identical. The output of the summer 624 is then fed to a second low pass filter 660 and then to a third low pass filter 662. The output of the third low pass filter 662 is then split either to an odd channel 664 filter or to an even channel filter 666. The odd channel filter has an output terminal 668 and the even channel has an output terminal 680. The outputs of converter 632 on lines 635 and 636 are essentially the same signal, which represents the AGC voltage for the system. This arrangement permits the relative gains for signals in stages 622 and 626 to be related by the factor k provided by MDAC 640, while permitting the overall system gain to be controlled by the AGC signal.

Figure 15:
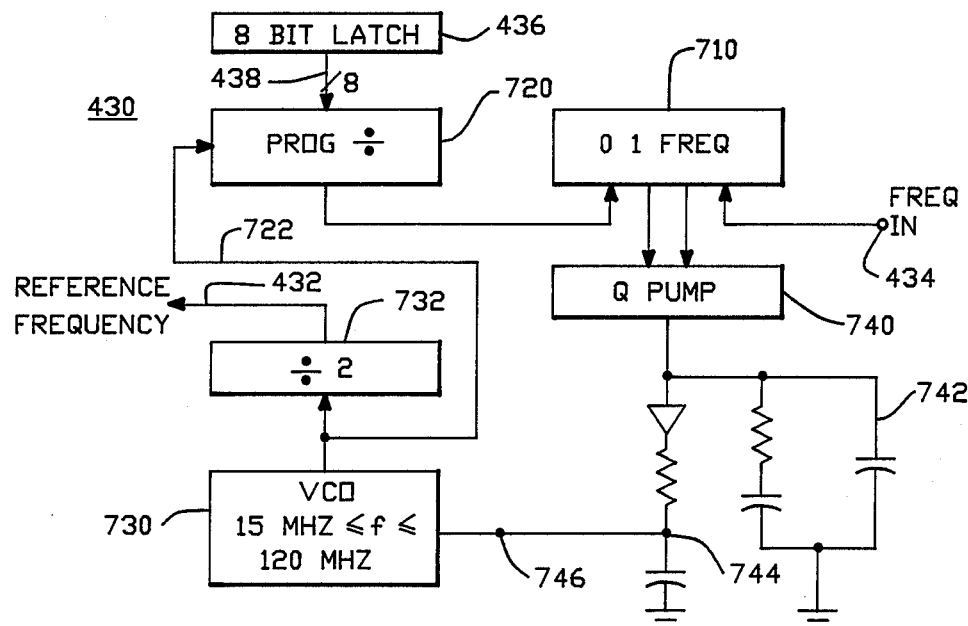
FIG. 15 is a block diagram of a frequency-synthesizer for producing a reference signal.

FIG. 15 shows further details of the frequency synthesizer 430 of FIG. 12. The reference frequency input at terminal 434 is applied to one input of a phase/frequency comparator 710 which has as its other input the output signal of the programmable divider 720. The divisor for the program divider is determined by the data bits stored in the 8-bit latch 436. The input to the programmable divider 720 is obtained on a signal line 722 from the output of the voltage controlled oscillator VCO 730. The output of the voltage control oscillator is also fed to a divide-by-two circuit 732, the output of which is a square wave reference frequency signal which is inputted to the control means 500 of FIG. 13 or the control means 420 of FIG. 12. The output signals of the phase to frequency comparator 710 are fed to a charge pump 740, the output of which is filtered by the filter network 742 and a network 744 and applied to the frequency control input, 746 of the voltage control oscillator 730. This frequency synthesizer 430 thus provides an output reference frequency signal on line 432, which signal is locked in frequency and phase to a reference input signal at terminal 434.

The arrangement of FIG. 15 is particularly useful in constant density magnetic recording systems where it is desirable that the cutoff frequency of the equalizer filter automatically track the servo output clock frequency. In this case the frequency reference signal for the synthesizer 430 is the servo output frequency recovered from the constant density disk drive. This permits the bandwidth of the equalizer filter to automatically track the servo frequency so that optimum signal-to-noise ratios can be obtained for recovery of encoded signals on the disk as a function of track position on the disk. Typical data transfer rates for a constant density magnetic disk range from 5 to 25 MHz with the VCO operating at a frequency two to four times higher. The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An electronically variable equalizer filter, having a variable cutoff frequency, comprising:
    two or more active RC filter networks each having variable R values, said one or more active RC networks being coupled together to form said equalizer filter; and
    means connected to each of said RC filter networks for simultaneously varying the R values of each of said two or more active RC networks, which means for simultaneously varying maintains a substantially constant ratio between the R values of each active RC filter network such that the relative shapes of the magnitude and phase characteristics of said equalizer filter remains substantially constant as the cutoff frequency of said equalizer filter is varied.

2. The variable filter of claim 1 wherein the means for simultaneously varying the R values includes means for generating a control signal to be applied to a control node of each of said RC networks to simultaneously control the R values of each of said active RC networks.

3. The variable filter of claim 2 wherein the means for generating a control signal includes:
    reference clock frequency means for providing a reference clock frequency signal;
    a first reference monostable multivibrator circuit: having a reference RC circuit with a reference RC value, having an input terminal coupled to said reference clock frequency signal, and having an output signal triggered by said reference clock frequency signal, said output signal having a pulse width determined by said reference RC circuit;
    a second monostable multivibrator circuit: having a variable RC circuit with an input terminal for controlling the RC value of said variable RC circuit, having an input terminal coupled to said reference clock frequency signal, and having an output signal triggered by said reference clock frequency signal, said output signal having a pulse width determined by the value of said variable RC circuit;
    a difference circuit having as inputs the output signals of said first and said second monostable multivibrator circuits and providing an output signal indicative of the difference in pulse widths of the output signals of said first and said second monostable multivibrators; and integrator means having as an input the output of said difference circuit and providing the control signal coupled to the input control terminal of said variable RC circuit for controlling the value of the variable RC circuit such that the value of the variable RC circuit is controlled by the control signal to match the value of the reference RC circuit.

4. The variable filter of claim 1 wherein one of said active RC networks is an active low pass filter having an input terminal and having an output signal, wherein another of said active RC networks is an active notch filter having an input terminal and having an output signal;

wherein the input terminal of said active low pass filter and the input terminal of said active notch filter are coupled together;

wherein the variable filter includes means for subtracting the output signal of the active notch filter from the output signal of the active low pass filter to provide a frequency boost in the response characteristic of said variable filter.

5. The variable filter of claim 4 including means for varying the output signal level of said active notch filter to control the amount of gain boost in the response characteristic of said variable filter for predetermined frequencies.

6. The variable filter of claim 4 wherein the active low pass filter has a transfer function, wherein the active notch filter has a transfer function, and wherein the transfer functions of said active low pass filter and said active notch filter have poles which are substantially the same to provide substantially constant group delay through the pass band of said variable filter.

7. An electronically variable equalizer filter, having a variable cutoff frequency, comprising:

two or more active RC network stages;

means for simultaneously varying the R values of said active RC network stages;

control means for controlling the variation of said R values including:

reference signal means having as an output a reference signal with predetermined frequency and pulse width;

a one-shot monostable multivibrator triggered by said reference signal and having an output signal, said one-shot monostable multivibrator having a variable resistor, the value of said variable resistor determining the pulse width of the output signal of said one-shot multivibrator, the value of which variable resistor is controlled by a signal on a control terminal of said variable resistor;

a comparator circuit having one input for receiving said reference signal and the other input for receiving the output signal of said one-shot monostable multivibrator wherein the output signal of said comparator circuit is coupled to the control terminal of said variable resistor, so that the pulse width of the output of said one-shot monostable multivibrator is controlled by the output signal of said comparator circuit;

wherein said output signal of said comparator circuit is coupled to said means for simultaneously varying the R values of said active RC network stages to vary the R values of said active RC network stages in accordance with the pulse width of the reference signal.

8. The filter of claim 7 including a programmable frequency synthesizer having means for providing a programmable output reference signals having pulse widths which control and the output signal of said comparator circuit for simultaneously varying the R values of said active RC network stages.

9. The filter of claim 7 wherein said two or more active RC network stages include at least one active RC low pass filter stage.

10. The filter of claim 7 wherein said equalizer filter includes means coupled to an output of said equalizer filter for providing an even function output signal and an odd function output signal wherein the odd function output signal is the first time derivative of the even function output signal.

11. An electronically variable equalizer filter having one or more active RC filter network stages, each stage having R values which can be varied to maintain a substantially constant ratio of said R values in each stage to thereby vary the cutoff frequency of said variable equalizer filter while maintaining the relative shapes of the gain, phase, and group delay characteristics of said variable equalizer filter over a range of cutoff frequencies, comprising:

said R values being formed on a single substrate;

a reference frequency signal;

control means, receiving said reference frequency signal, for generating a control signal, which is used to simultaneously vary the R values in each of said one or more active RC filter network stages;

said control means including a monostable multivibrator circuit triggered by said reference frequency and providing a multivibrator output signal, said multivibrator circuit including means for determining the pulse width of said multivibrator output signal, means for comparing the pulse widths of said reference frequency signal and said multivibrator output signal to provide a control signal;

said control signal being coupled to the means for determining the pulse width of said multivibrator output signal so that the pulse width of the multivibrator output signal is proportionately equal to the reference pulse width; and said control signal being coupled to control said R values and to vary said R values in accordance with the pulse width of said reference signal.

12. A programmably-tuned electronic equalizer filter for constant-density magnetic-disk recording, comprising an electronically tuned low-pass filter having a programmably variable cutoff frequency and having a low-pass output terminal at which is provided a low-pass output signal and having a differentiated low-pass output terminal at which is provided a differentiated low-pass output signal wherein said low-pass output signal and said differentiated low-pass output signal have matched group delay characteristics.

13. The equalizer filter of claim 12 including programmable means for pulse slimming pulse signals which are passed through said equalizer filter, said pulse slimming means including means for combining a signal which is passed through a first low-pass filter section with the same signal which is passed through a second filter section so that higher frequency signal components are variably boosted in amplitude to provide variable pulse slimming for said pulse signal.

14. The equalizer filter of claim 13 wherein said programmable means for pulse slimming includes:
- the first low-pass filter section having input terminals, output terminals, and a control terminal, said input terminal for receiving an input signal to said programmable electronic equalizer filter;
- a first high pass filter section having an input terminal, an output terminal, and a control terminal, said input terminal connected to the input terminal of said first low-pass filter section;
- an electronically controlled variable attenuator means having an input terminal connected to the output terminal of said first high pass filter and having an output terminal;
- a summer means having a first input terminal connected to the output terminal of said first low-pass filter section and a second input terminal connected to the output terminal of said variable attenuator, said summer circuit having an output terminal;
- a second low-pass filter section having an input terminal, an output terminal, and a control terminal, said input terminal of said second low-pass filter connected to the output terminal of said summer means;
- a second high pass filter section having an input terminal, an output terminal, and a control terminal, said input terminal connected to the output of said summer means; and
- wherein programmable pulse slimming is obtained by controlling the amount of output signal obtained from the first high pass filter through the variable attenuator means.

15. In a constant-density magnetic disk storage system, including a magnetic storage disk having information recorded with constant density and wherein a recovered read-frequency clock signal varies as a function of the radial position of a corresponding recording track on said disk, the improvement comprising: a programmable-tuned electronic equalizer filter comprising an electronically tuned low-pass filter having a programmably variable cutoff frequency and having a low-pass output terminal at which is provided a low-pass output signal and having a differentiated low-pass output terminal at which is provided a differentiated low-pass output signal wherein said low-pass output signal and said differentiated low-pass output signal have matched group delay characteristics.

16. The system of claim 15 including means for tracking the frequency of the read frequency clock and for providing a control signal for tuning the cutoff frequency of the low-pass filter to track the frequency of the read frequency clock.

17. The system of claim 16 wherein said equalizer filter includes:
- two or more active RC filter networks each having variable R values, said one or more active RC networks being coupled together to form said equalizer filter; and
- means connected to each of said RC filter networks for simultaneously varying the R values of each of said two or more active RC networks, which means for simultaneously varying maintains a substantially constant ratio between the R values of each active RC filter network such that the relative shapes of the magnitude and phase characteristics of said equalizer filter remains substantially constant as the cutoff frequency of said equalizer filter is varied to track the frequency of the read frequency clock.

* * * * *